(12) United States Patent
Krech, Jr. et al.

(10) Patent No.: US 6,748,562 B1
(45) Date of Patent: Jun. 8, 2004

(54) MEMORY TESTER OMITS PROGRAMMING OF ADDRESSES IN DETECTED BAD COLUMNS

(75) Inventors: Alan S Krech, Jr., Fort Collins, CO (US); John M Freeseman, Fort Collins, CO (US); Ken Hanh Duc Lai, San Jose, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 430 days.

(21) Appl. No.: 09/702,578

(22) Filed: Oct. 31, 2000

(51) Int. Cl.[7] .............................. G11C 29/00

(52) U.S. Cl. ........................ 714/723; 714/710

(58) Field of Search ................ 714/723, 710, 714/48, 718, 53, 711

(56) References Cited

U.S. PATENT DOCUMENTS

| | | | | |
|---|---|---|---|---|
| 5,815,448 A | * | 9/1998 | Horiguchi et al. | 365/200 |
| 6,260,156 B1 | * | 7/2001 | Garvin et al. | 714/8 |
| 6,484,271 B1 | * | 11/2002 | Gray | 714/6 |

* cited by examiner

*Primary Examiner*—Phung M. Chung
(74) *Attorney, Agent, or Firm*—Edward L. Miller

(57) ABSTRACT

A test program generates transmit vectors (stimuli) and receive vectors (expected responses). The transmit vectors are applied to the DUT, while the receive vectors are treated as comparison values used to decide if a response from the DUT is as expected. While programming a FLASH part the test program uses TAG RAM techniques to maintain a BAD COLUMN table in one of the memory sets. This BAD COLUMN table is addressed by the same address that is applied to the DUT. If an OMIT BAD COLUMN mode is in effect, entries in this table are, by automatic action of the memory tester hardware, obtained and used to supply a replacement programming data value of all 1's that will produce an immediate and automatic indication of successful programming from the DUT. This prevents spending extra time programming a column that has been determined to be bad, without requiring an alteration in the internal mechanism of the test program. The discovery of bad columns and their recordation in the BAD COLUMN table can be performed during an initial programming phase of the test program, or it can be performed on an "as-discovered" basis during the course of exercising a programmed FLASH DUT. These features may be combined with automatic reading of a special BAD BLOCK table created in interior test memory to facilitate the testing of memory parts that have an internal block structure, by automatically disabling, and removing from further influence on the test program, actions related to a bad block. That bad block may or may not be in a DUT that is being tested in a multi-DUT fashion.

2 Claims, 7 Drawing Sheets

MEMORY TESTER OMITS PROGRAMMING OF ADDRESSES IN DETECTED BAD COLUMNS

REFERENCE TO RELATED APPLICATIONS

The subject matter of the instant Patent Application is related to that disclosed in a pending U.S. Patent Application entitled MEMORY TESTER HAS MEMORY SETS CONFIGURABLE FOR USE AS ERROR CATCH RAM, TAG RAM's, BUFFER MEMORIES AND STIMULUS LOG RAM, Ser. No. 09/672,650 and filed on Sep. 28, 2000. That disclosure describes aspect of operations called Address Classification and Data Classification that are of interest herein. For that reason U.S. patent application Ser. No. 09/672,650 is hereby expressly incorporated herein by reference.

The subject matter of the instant Patent Application is also related to that disclosed in a U.S. patent application entitled MEMORY TESTER TESTS MULTIPLE DUT'S PER TEST SITE, Ser. No. 09/677,202 and filed on Oct. 2, 2000. That disclosure is related to techniques for testing a plurality of "little" devices as though they were one "big" device. Although not essential, those techniques are useful and of interest to the instant Application, since they cooperate and may often be used in conjunction with the techniques of the instant Application. For that reason, the aforementioned U.S. patent application Ser. No. 09/677,202 is hereby expressly incorporated herein by reference.

BACKGROUND OF THE INVENTION

Electronics devices and capabilities have grown extremely common in daily life. Along with personal computers in the home, many individuals carry more than one productivity tool for various and sundry purposes. Most personal productivity electronic devices include some form of non-volatile memory. Cell phones utilize non-volatile memory in order to store and retain user programmed phone numbers and configurations when the power is turned off. PCMCIA cards utilize non-volatile memory to store and retain information even when the card is removed from its slot in the computer. Many other common electronic devices also benefit from the long-term storage capability of non-volatile memory in un-powered assemblies.

Non-volatile memory manufacturers that sell to the electronic equipment manufacturers require testers to exercise and verify the proper operation of the memories that they produce. Due to the volume of non-volatile memories that are manufactured and sold at consistently low prices, it is very important to minimize the time it takes to test a single part. Purchasers of non-volatile memories require memory manufacturers to provide high shipment yields because of the cost savings associated with the practice of incorporating the memory devices into more expensive assemblies with minimal or no testing. Accordingly, the memory testing process must be sufficiently efficient to identify a large percentage of non-conforming parts and preferably all non-conforming parts in a single test process.

As non-volatile memories become larger, denser and more complex, the testers must be able to handle the increased size and complexity without significantly increasing the time it takes to test them. Memory testers frequently run continuously, and test time is considered a major factor in the cost of the final part. As memories evolve and improve, the tester must be able to easily accommodate the changes made to the device. Another issue specific to testing non-volatile memories is that repeated writes to cells of the memories can degrade the overall lifetime performance of the part. Non-volatile memory manufacturers have responded to many of these testing issues by building special test modes into the memory devices. These test modes are not used at all by the purchaser of the memory, but may be accessed by the manufacturer to test all or significant portions of the memories in as little time as possible and as efficiently as possible. Some non-volatile memories are also capable of being repaired during the test process. The tester, therefore, should be able to identify: a need for repair; a location of the repair; the type of repair needed; and, must then be able to perform the appropriate repair. Such a repair process requires a tester that is able to detect and isolate a specific nonconforming portion of the memory. In order to take full advantage of the special test modes as well as the repair functions, it is beneficial for a tester to be able to execute a test program that supports conditional branching based upon an expected response from the device.

From a conceptual perspective, the process of testing memories is an algorithmic process. As an example, typical tests include sequentially incrementing or decrementing memory addresses while writing 0's and 1's into the memory cells. It is customary to refer to a collection of 1's and 0's being written or read during a memory cycle as a "vector", while the term "pattern" refers to a sequence of vectors. It is conventional for tests to include writing patterns into the memory space such as checkerboards, walking 1's and butterfly patterns. A test developer can more easily and efficiently generate a program to create these patterns with the aid of algorithmic constructs. A test pattern that is algorithmically coherent is also easier to debug and facilitates the use of logical methods to isolate portions of the pattern that do not perform as expected. A test pattern that is generated algorithmically using instructions and commands that are repeated in programming loops consumes less space in tester memory. Accordingly, it is desirable to have algorithmic test pattern generation capability in a memory tester.

Precise signal edge placement and detection is also a consideration in the effectiveness of a non-volatile memory tester. In order to identify parts that are generally conforming at a median while not conforming within the specified margins, a non-volatile memory tester must be able to precisely place each signal edge relative in time to another signal edge. It is also important to be able to precisely measure at which point in time a signal edge is received. Accordingly, a non-volatile memory tester should have sufficient flexibility and control of the timing and placement of stimuli and responses from the Device Under Test (memory).

Memory testers are said to generate transmit vectors that are applied (stimulus) to the DUT (Device Under Test), and receive vectors that are expected in return (response). The algorithmic logic that generates these vectors can generally do so without troubling itself about how a particular bit in a vector is to get to or from a particular signal pad in the DUT, as the memory tester contains mapping arrangements to route signals to and from the pins that contact the DUT. The collection of the algorithmic pattern generation, threshold setting, signal conditioning and comparison mechanisms, and the probes that connect that stuff to the DUT, is called a test site. In the simple case there is one DUT per test site.

Memory testers have interior test memory that is used to facilitate the test process. This interior test memory may be used for several purposes, among which are storing transmit vectors ahead of time, as opposed to generating them in real time, storing expected receive vectors, and storing a variety of error indications and other information concerning DUT behavior obtained during testing. (There are also housekeeping purposes internal to the operation of the memory tester that use RAM and that may appear to fall within the purview of the phrase "interior memory." These are private to the internal operation of the tester, tend to not be visible at the algorithmic level, and are comparable to executable instruction stores and to internal control registers. That memory is described as "interior control memory," and is excluded from what is meant herein by the term "interior test memory," which we use to describe memory used to store bit patterns directly related to the stimulus of, and response from, the DUT.) It is easy to appreciate that this interior test memory needs to operate at least as fast as the tests being performed; a very common paradigm is for the interior test memory (or some portion thereof) to be addressed by the same address (or some derivative thereof) as is applied to the DUT. What is then stored at that addressed location in interior test memory is something indicative of DUT behavior during a test operation performed on the DUT at that address. Algorithmic considerations within the test program may mean that the sequence of addresses associated with consecutive transmit vectors can be arbitrary. Thus, the interior memory needs to have the dual attributes of high speed and random addressability. SRAM comes to mind immediately as being fast, easy to control and tolerant of totally random addressing. Indeed, conventional memory testers have used SRAM as their interior test memory.

Unfortunately, SRAM is quite expensive, and this has limited the amount of interior test memory with which memory testers have had to work. The result is limits on memory tester functionality that are imposed by a shortage of memory. DRAM is significantly less expensive, but cannot tolerate random addressing and still perform at high speed.

DRAM can replace SRAM as the interior test memory in a memory tester. As briefly described below, the problem of increasing the speed of DRAM operation for use as interior test memory can be solved by increasing the amount of DRAM used, in place of increasing its speed. Numbers of identical Banks of DRAM are treated as Groups. A combination of interleaving signals for different Banks of memory in a Group thereof and multiplexing between those Groups of Banks slows the memory traffic for any one Bank down to a rate that can be handled by the Bank.

At the top level of interior test memory organization there are four Memory Sets, each having its own separate and independent address space and performing requested memory transactions. Two are of SDRAM as described above, and two are of SRAM. Each Memory Set has its own controller to which memory transactions are directed. As to externally visible operational capabilities as memories, all four Memory Sets are essentially identical. They differ only in their size of memory space and how they are internally implemented: The SRAM Memory Sets do not employ multiplexing and interleaving, since they are fast enough to begin with. Despite their independence, Memory Sets of the same type (of SRAM or of DRAM) may be "stacked," which is to say treated a one larger address space.

Thus it is that the interior test memory of the tester is divided into four Memory Sets, two of which are "internal" SRAM's and two of which are "external" DRAM's. To be sure, all this memory is physically inside the memory tester; the terms "internal" and "external" have more to do with a level of integration. The SRAM's are integral parts of a VLSI (Very Large Scale Integration) circuit associated with the tester's central functional circuitry, while the DRAM's are individual packaged parts mounted adjacent the VLSI stuff. The amount of SRAM is fairly small, (say, around a megabit per Memory Set) while the amount of DRAM is substantial and selectable (say, in the range of 128 to 1024 megabits per Memory Set). The SRAM Memory Sets are always present, and may be used for any suitable purpose, such as storing the expected content of a DUT that is a ROM (Read Only Memory). The DRAM Memory Sets, although actually optional, are typically used for creating a trace for subsequent analysis leading to repair, although there are also other uses. The tester need not, in principle, enforce distinctions between the SRAM and DRAM Memory Sets, as to different purposes for which they may be used. There are some practical distinctions that arise mostly as a matter of size; the SRAM Memory Sets are small, while the DRAM Memory Sets are potentially huge. The person or persons creating the test programming generally make the decisions concerning how the various Memory Sets are to be used. There are, however, a few distinctions where a particular operational feature of the memory tester requires the use of a specific Memory Set. These cases usually arise out of economic or performance considerations that require a dedicated hardware path to a Memory Set. While these mechanisms could be generalized, it is expedient to simply pick a likely one, and let it go at that.

The advent of substantial amounts of interior test memory (in the form of the DRAM Memory Sets) raises the issue of how this additional amount of memory can be used to facilitate the operation of desirable features within the memory tester. In the tester of interest the interior test memory subsystem is extremely flexible, in that despite having a native word width of thirty-two bits, the effective word width can be any power of two (up to $2^5=32$), with a corresponding increase in address space for narrower words. There is an extensive address mapping capability, both for addressing DUT's and for addressing interior test memory, substantial data classification and address classification mechanisms that facilitate multiple Tag RAM's and other error analysis tools, all of which are made more practical by having lots of interior test memory. Moreover, these enhancements made possible by more memory do not exist in a vacuum; they are very valuable in the testing of certain types of memory parts.

Despite that recent advances have produced memory parts of truly enormous capacity (512 MB) and wide data paths (thirty-two bits), yesterday's four, eight and sixteen bit parts are still solidly in commercial service. It is even the case that some high capacity parts have been "throttled down" to a narrow path for address and data, even at the expense of serialization or of supporting multiple cycle segmentation to transport whole data of a wider native word width. There are various reasons for this situation: either small parts are all that is needed, or, the application is such that big parts can have narrow paths (video applications that are always addressed sequentially). Suffice it to say that there are good economic reasons why memory parts with narrow paths are well received in the market. And that means that they have to be tested.

From time to time it may be desirable to check eight bit parts on a memory tester having sixty-four channels per test head. What with supplies and ground, I/O bus, clocks and assorted control lines, there are perhaps from twelve to sixteen channels that will be needed. Suppose it is fourteen. This does not mean that fifty channels will be left unused when the part to be tested is located under the test head.

Note that sixty-four channels is enough to do as many as sixteen channels four times. A combination of four undiced DUT's on a wafer, or four packaged parts, can be construed as some strange single big part that just happens to look exactly like the union of four little parts. In theory, those four little parts can be tested at the same time, simultaneously, under the same test head. The trouble is that it is awkward and inconvenient. The test program has to be re-written, so that a single-thread-of-control test program emulates a four-threads-of-control test program, where each of those four threads (what is done for an individual DUT) has conditional branching and other result dependent behavior. This would be a very ugly business that might seem to be better served by four independent execution mechanisms with four simple programs whose internal execution paths could independently diverge as needed. But then, how to return to the other extreme, where all sixty-four channels need to be controlled by one program testing an actual single big part? Four little processors do not make a big processor!

The internal architecture of a memory tester can be enhanced to support the testing of multiple DUT's of the same type at a test site, while requiring only minor modifications to a test program that would ordinarily be used to test a single DUT. The multiple DUT's are electrically isolated from one another, but are, at least at the outset, given the same stimulus from which the same response is expected. To do this the DUT's are each associated with collections of channels that are to be used to test their respective DUT's. The tester can be instructed to replicate the segments of the test vectors needed to test one DUT on the channels for the other DUT's. This produces patterns of (sequences of) transmit (stimulus) and receive (response) vectors that are "n-many DUT's wide," as it were. Conditional branching within the test program in response to conditions in the receive vectors (DUT failure) is supported by recognizing several types of error indications and an ability to selectively disable the testing of one or more DUT's while continuing to test the one or more that are not disabled. The error indications include per channel functional error flags and per DUT functional error flags, as well as per DUT parametric error flags. The per DUT functional error flags are created from an OR'ing of the per channel functional error flags done in accordance with the DUT to channel association. These flags are reported back to the test program, which can then take various appropriate actions that alter program flow to invoke special testing or other actions for the suspect DUT. The error conditions are also detected by pre-programmed mechanisms within the circuitry that applies transmit vectors and evaluates receive vectors. These latter pre-programmed mechanisms produce actions that include, on a per channel basis, the ability to alter the drive and receive formats for the DUT signal of that channel, and the ability to alter a data value associated with the DUT signal of that channel. Also included are ways to remove or limit stimulus to particular DUT's, as well as ways to make all comparisons for a particular DUT appear to be "good," regardless of the true facts. These latter mechanisms remove the need for multiple threads of execution in the test program.

The test program is thus empowered to simultaneously test a plurality (up to four in a preferred embodiment) of DUT's "in parallel" as long as no errors are reported. Upon an error the test program can branch to an error investigation routine that exercises only the suspect DUT by temporarily disabling the good DUT's while continuing to exercise the bad DUT. If the bad DUT is defective beyond repair, or is unsafe to leave powered up, it can be disabled, the other DUT's re-enabled and regular testing resumed. In this way, a single thread of execution (that would exist in essentially this same form for testing a single DUT) can be selectively switched between (executed on behalf of) the different DUT's on an as needed basis, driven by which one(s) fail(s). During these selectively switched intervals simultaneous testing of all DUT's is suspended in favor of a digression that tests a particular DUT of interest. To be sure, this switching and jumping to execute digressions is also programmatically defined to occur in response to contingent events discovered while testing. Part of this programmatic definition are easily performed modifications to the single threaded test program (which remains single threaded) and part of it is pre-configuration of various hardware assist mechanisms.

Certain types of memory technology, such as FLASH memory, have particular properties that affect the way they are used and also the way they can be tested. With FLASH memory, for example, it is typically the case that an erase function is used to get the device (or a portion thereof, called a block) to store all 1's, and to write a 0 it is "programmed" by a repeated write operation performed at the address that is to store the 0. Whereas an erase is a mass operation affecting a large number of addresses (either the entire device or the block containing a supplied address), programming a 0 at an addressed location involves repeating a write operation until sufficient charge transfer has occurred in the addressed memory cell. For modern FLASH memory, the device itself internally reads back the cell contents during automated internal writes repeatedly performed until the programming has occurred. For example, an eight-bit device would internally check the eight bits at that address, and programming would continue internally until each of the however many 0's there are among those eight bits has been successfully programmed. Some cells in the memory may program more readily than others, and it may take several hundred write cycles to program a 0.

A modern FLASH device accepts such operations in the form of commands, and reports the eventual success or failure of their outcome on output lines driven by a status register. So, for example, an address and some data can be supplied to the device, and a program line or command exerted. The status register goes to, say, all 0's to indicate "I'm busy," and in due course changes to all 1's to indicate "I'm finished and it worked." Any other bit patterns in this sequence of operations would be an error code descriptive of some sort of trouble.

Re-programming an address to have a 1 after it has been previously programmed to contain a 0 is an allowed operation, but is one that cannot be performed, owing to the way FLASH devices are constructed. If there is a need to do that the entire device (or the block containing that address) must be erased, and programming begun over again. Nevertheless, it has become a standard mode of operation for FLASH devices to accept commands to program 1's, and ignore them while reporting immediate success.

Thus, from afar the test paradigm for a FLASH part looks like a three part procedure. First the part is erased. Second, the part is programmed, and then (third) it is exercised. To be sure, getting the part successfully programmed is part of what is properly considered testing of the device. Once programmed, however, the test engineer may want to exercise it by varying supply voltages, checking timing relationships, and ensuring that addressing sequences and patterns in the stored data do not adversely affect operation. The complete battery of tests for a FLASH part may include several such three part procedures, each with a different collection of programmed data, and perhaps with different exercise activities. Generally speaking, exercising the part is not where test time is spent; it is spent erasing and programming the part.

The internal organization of some memories, including FLASH parts, involves the notion of columns. There are many addresses associated with a column, and if there should be a failure in the column decoding, many addresses will be affected. Even in the case where there is simply a bad cell in a column (i.e., a single bit failure at a single address), we would still have to say that the column is defective. Either way, at some point in a programming phase there will be an address that does not program successfully. At that point we would say the column containing that address is bad.

The discovery that a column in a FLASH part is defective can occur during programming, or it can be discovered while exercising. The latter case is difficult to characterize ahead of time, and since it likely won't be reported as status information by the device itself, it will need to be detected by suitable algorithmic mechanisms in the test program.

Whether or not a bad column can be repaired is another issue, and is one which will probably be decided at a different time. (A decision to attempt a repair might best be delayed until after a preliminary testing reveals the scope of any repairable failures: in any DUT there is only a fixed number of substitute circuits that can be switched in by "zapping" fusible links within the device.) For the present we could save some time on the tester if, for the balance of the testing for that part, we could arrange to not spend any more time trying to program other addresses in that column.

Whether the bad column is discovered while performing multi-DUT per test head testing or while performing single DUT per test head operations, it would thus be desirable (and especially so in the multi-DUT case) to take note of that fact with the intention of dealing with it later (probably by an attempted repair). In the meantime, however, it is desirable to continue the testing (for the benefit of the other columns), while suppressing attempts to perform any further programming on the bad column. Unless such a mechanism is in place, extra time will be wasted trying to program addresses that are in the bad column. While it is reasonable to ask that a test program decide during exercising if a column is defective (in a way that is what the test is for), it is undesirable to burden that test program (whether during programming or exercising) with the further task of altering subsequent program flow to avoid further programming of other addresses within a column that is known to be bad. This is especially so in a multi-DUT situation.

What to do?

SUMMARY OF THE INVENTION

A test program generates transmit vectors (stimuli) and receive vectors (expected responses). The transmit vectors are applied to the DUT, while the receive vectors are treated as comparison values used to decide if a response from the DUT is as expected. While programming a FLASH part the test program uses TAG RAM techniques to maintain a BAD COLUMN table in one of the memory sets. This BAD COLUMN table is addressed by the same address that is applied to the DUT. If an OMIT BAD COLUMN mode is in effect, entries in this table are, by automatic action of the memory tester hardware, obtained and used to supply a replacement programming data value of all 1's (or some other pattern) that will produce an immediate and automatic indication of successful programming from the DUT. This prevents spending extra time programming a column that has been determined to be bad, without requiring an alteration in the internal mechanism of the test program. The discovery of bad columns and their recordation in the BAD COLUMN table can be performed during an initial programming phase of the test program, or it can be performed on an "as-discovered" basis during the course of exercising a programmed FLASH DUT.

These features may be combined with automatic reading of a special BAD BLOCK table created in interior test memory to facilitate the testing of memory parts that have an internal block structure, by automatically disabling, and removing from further influence on the test program, actions related to a bad block. That bad block may or may not be in a DUT that is being tested in a multi-DUT fashion.

DESCRIPTION OF A PREFERRED EMBODIMENT

Figure 1:
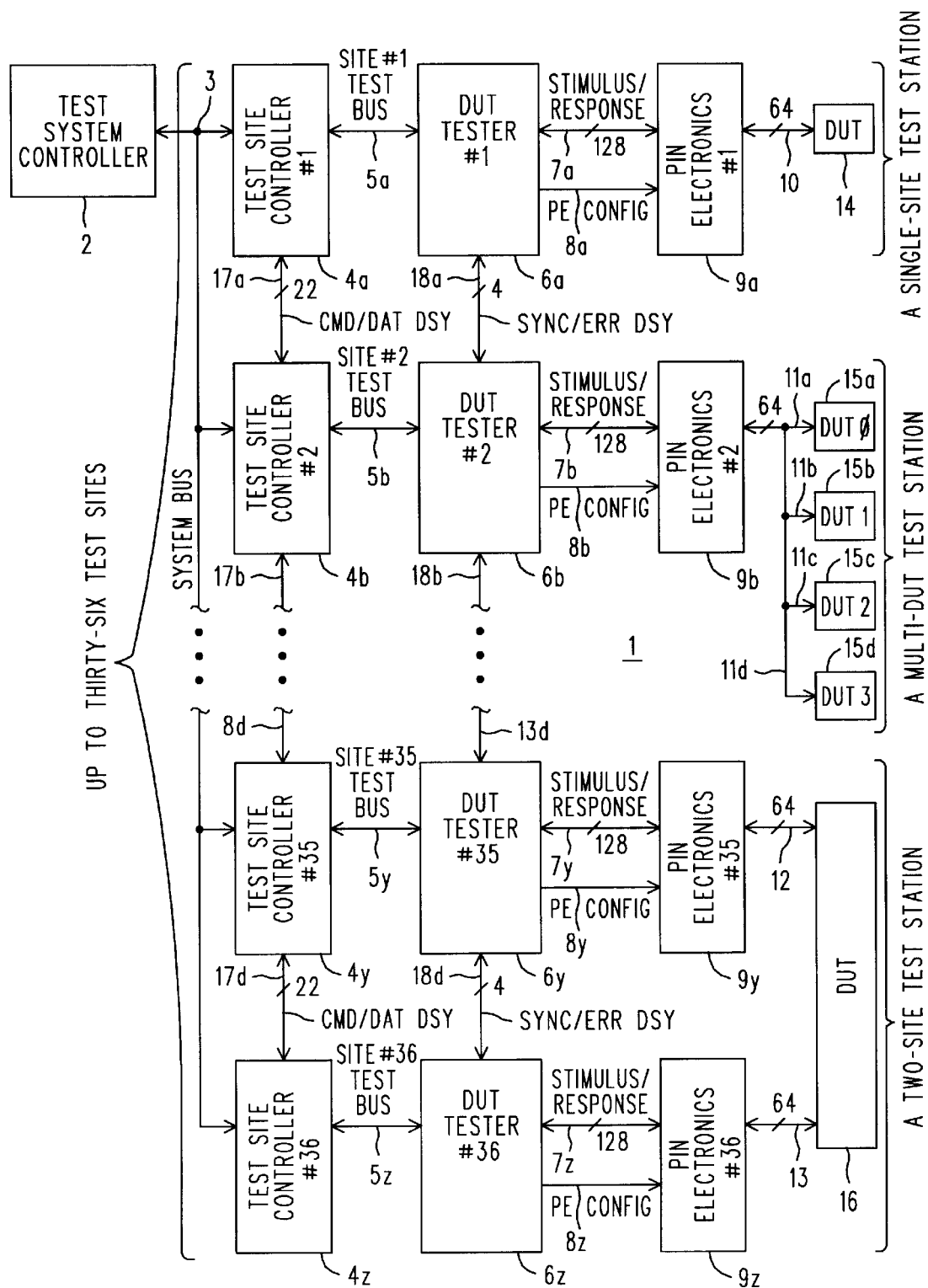
FIG. 1 is a simplified block diagram of an extensively reconfigurable non-volatile memory tester constructed in accordance with the invention.

Refer now to FIG. 1, wherein is shown a simplified block diagram 1 of a Non-Volatile Memory Test System constructed in accordance with the principles of the invention. In particular, the system shown can simultaneously test, with as many as sixty-four test points each, up to thirty-six individual DUT's (Devices Under Test) at one time, with provisions for reconfiguration to allow elements of a collection of test resources to be bonded together to test DUT's having more than sixty-four test points. These test points may be locations on a portion of an integrated circuit wafer that has not yet been diced and packaged, or they might be the pins of a packaged part. The term "test point" refers to an electrical location where a signal may be applied (e.g., power supplies, clocks, data inputs) or where a signal can be measured (e.g., a data output). We shall follow the industry custom of referring to the test points as "channels". The "collection of test resources to be bonded together" referred to above may be understood as being as many as thirty-six test sites, where each test site includes a Test Site Controller (4), a (sixty-four channel) DUT Tester (6) and a (sixty-four channel) collection of Pin Electronics (9) that makes actual electrical connection to a DUT (14). In the case where testing the DUT requires sixty-four or fewer channels, a single Test Site is sufficient to perform tests upon that DUT, and we say, for example, that the Test Site #1 (as it appears in FIG. 1) forms or operates as a "Single Site Test Station". On the other hand, when some form of the aforementioned reconfiguration is in effect, two (or more) Test Sites are "bonded" together to function as one larger equivalent Test Site having one hundred and twenty-eight channels. Accordingly, and again in reference to an example shown in FIG. 1, we say that Test Sites #35 and #36 form a "two-Site Test Station".

Figure 2:
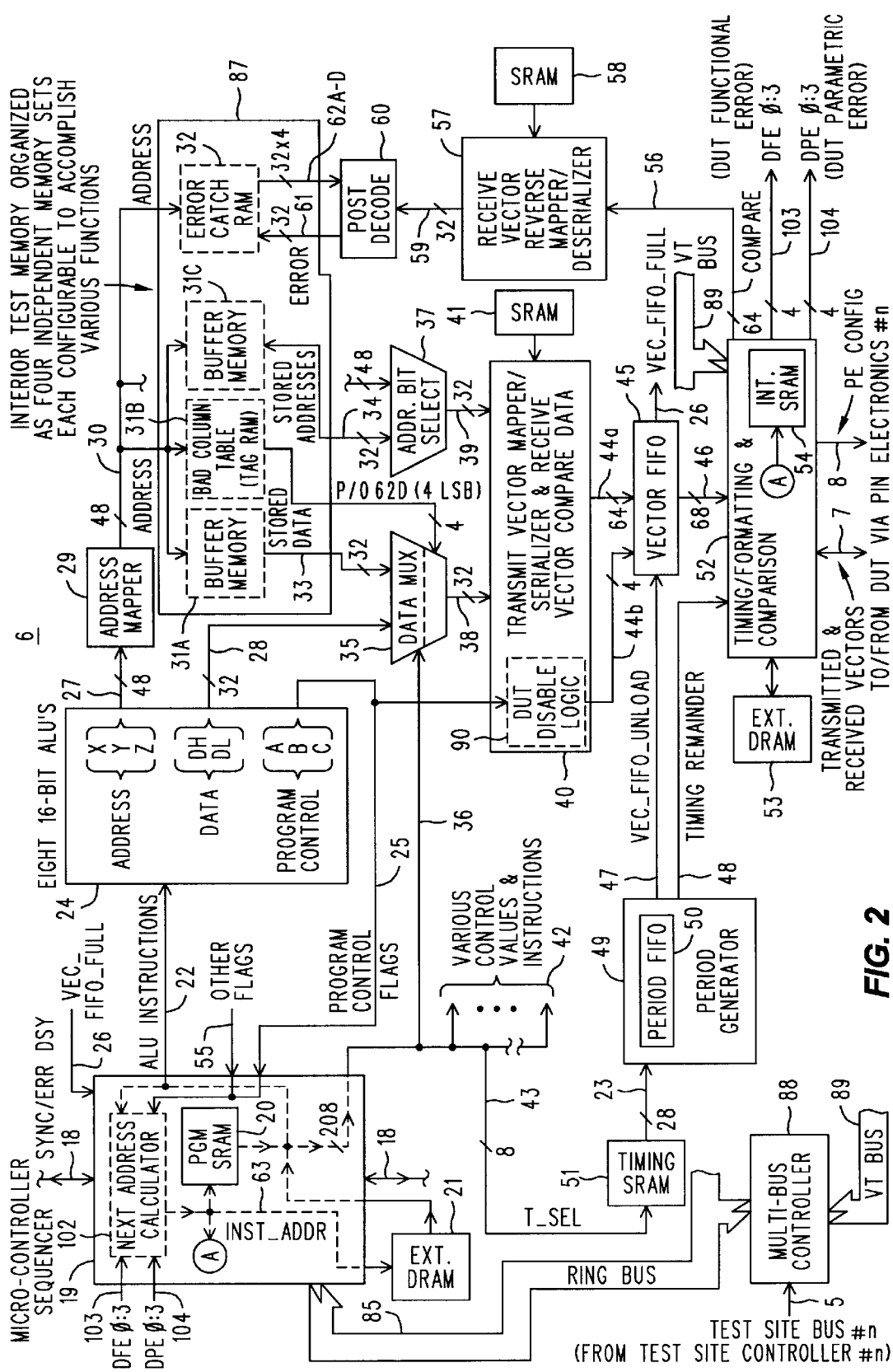
FIG. 2 is a simplified block diagram expansion of the DUT tester 6 of FIG. 1.

To briefly consider an opposing case, one should not assume that an entire Test Site is needed to test a single DUT, or that a single Test Site can test but a single DUT. Suppose that a wafer had two, three or four (probably, but not necessarily, adjacent) dies, the sum of whose test channel requirements were sixty-four channels or less. Such DUT's (15a–d) can be tested simultaneous by a single Test Site (e.g., Test Site #2 as shown in FIG. 2). What makes this possible is the general purpose programmability of each Test Site, as augmented by certain hardware features to be described in due course. In principle, a test program executed by the Test Site could be written such that one part of the Test Site's resources is used to test one of the DUT's while another part is used to test the other DUT. After all, we would assume that if we had a third DUT that were the logical union of the first two, then we would be able to test that third DUT with a single Test Site, so we ought to be able to similarly test its "component DUT's", as it were. A major difference is, of course, individually keeping track of which of the two "component DUT's" pass or fail, as opposed to a simple unified answer for the "third" DUT. That is, there is an issue concerning what portion of the "third" DUT failed. There are other issues as well, including removing or limiting the drive signals to a bad DUT, branching within the test program based on which DUT indicates failure, while at the same time preventing the test program from becoming hopelessly multi-threaded. Certain simple aspects of this "Multi-DUT Test Station" capability at a single Test Site are fairly simple, while others are complex. Multi-DUT testing should not be confused with the notion of bonding two or more Test Sites together.

Were it not for this notion of Test Site reconfiguration there would be no difference between a Test Site and a Test Station, and we would dispense with one of the terms. As it is, however, it will be readily appreciated that the number of Test Stations need not equal the number of Test Sites. In the past, the numbers could be different because Test Sites were sometimes split to create more Test Stations for simple Multi-DUT testing (DUT's not complex enough to consume an entire Test Site). Now, however, the difference may also be due to Test Sites having been bonded together to form multi-site Test Stations (DUT's too complex for a single Test Site).

To continue, then, a Test System Controller 2 is connected by a System Bus 3 to as many as thirty-six Test Site Controllers whose names end in the suffixes #1 through #36 (4a–4z). (It is true that subscripts a-z only go from one to twenty-six, and not to thirty-six. But this minor deception seems preferable over numerical subscripts on numerical reference characters, which would be potentially very confusing.) The Test System Controller 2 is a computer (e.g., a PC running NT) executing a suitable Test System Control Program pertaining to the task of testing non-volatile memories. The Test System Control Program represents the highest level of abstraction in a hierarchical division of labor (and of complexity) for accomplishing the desired testing. The Test System Controller determines which programs are being run by the different Test Sites, as well as overseeing a robotics system (not shown) that moves the test probes and DUT's as needed. Test System Controller 2 may function in ways that support the notion that some Test Sites are programmed to perform as single-site Test Stations, some as multi-DUT Test Stations, while others are bonded together to form multi-site Test Stations. Clearly, in such circumstances there are different parts being tested, and it is most desirable that different tests be used for the different parts. Likewise, there is no requirement that all single-site Test Stations be testing the same style of part, nor is there any such requirement for multi-site Test Stations. Accordingly, the Test System Controller 2 is programmed to issue the commands to accomplish the needed Test Site bonding and then to invoke the appropriate test programs for the various Test Stations in use. The Test System Controller 2 also receives information about results obtained from the tests, so that it may take the appropriate action for discarding the bad part and so that it may maintain logs for the various analyses that may be used to control, say, production processes in a factory setting.

The Test System itself is a fairly large and complex system, and it is common for it to use a robotics subsystem to load wafers onto a stage that then sequentially positions one or more future dies under probes connected to the Pin Electronics 9, whereupon those future dies (the wafer has not yet been diced) are tested. The Test System can also be used to test packaged parts that have been loaded onto a suitable carrier. There will be (as is explained below), at least one Test Site Controller associated with each Test Station in use, regardless of how many Test Sites are used to form that Test Station, or of how many Test Stations are on a Test Site. A Test Site Controller is an embedded system that may be an i960 processor from Intel with thirty-six to sixty-four MB of combined program and data memory running a proprietary operating system called VOS (VersaTest O/S), which was also used in earlier products for testing non-volatile memories (e.g., the Agilent V1300 or V3300). For the moment, we shall consider only the situation for single-site Test Stations. For the sake of a definite example, suppose that Test Site #1 is functioning as Test Station #1, and that it is to test the WHIZCO part no. 0013. The test regimen involves a hundred or so different types of tests (varying and monitoring voltage levels, pulse widths, edge positions, delays, as well as a large dose of simply storing and then retrieving selected patterns of information), and each type of test involves many millions of individual memory cycles for the DUT. At the highest level, the operators of the Test System instruct the Test System Controller 2 to use Test Station #1 to begin testing WHIZCO 0013's. In due course the Test System Controller 2 tells Test Site Controller #1 (4a) (which is an embedded [computer] system) to run the associated test program, say, TEST_WHIZ_13. If that program is already available within Test Site Controller #1's environment, then it is simply executed. If not, then it is supplied by the Test System Controller 2.

Now, in principle, the program TEST_WHIZ_13 could be entirely self-contained. But if it were, then it would almost certainly be rather large, and it may be difficult for the processor of the embedded system within the Test Site Controller 4a to run fast enough to produce the tests at the desired speed, or even at a rate that is uniform from one DUT memory cycle to the next. Accordingly, low level subroutine type activities that generate sequences of address and associated data that is to be written or is expected from a read operation, are generated as needed by a programmable algorithmic mechanism located in the DUT Tester 6, but that operates in synchrony with the program being executed by the embedded system in the Test Site Controller 4. Think of this as exporting certain low level subroutine-like activity and the task of initiating DUT memory cycles out to a mechanism (the DUT Tester) that is closer to the hardware environment of the DUT 14. Generally speaking, then, whenever the Test System Controller 2 equips a Test Site Controller with a test program it also supplies the associated DUT Tester with appropriate low level implementation routines (perhaps specific to the memory being tested) needed to accomplish the overall activity described or needed by the programming for the Test Site Controller. The low level implementation routines are termed "patterns", and they are generally named (just as functions and variables in high level programming languages have names).

Each Test Site Controller #n (4) is coupled to its associated DUT Tester #n (6) by a Site Test Bus #n (5). The Test Site Controller uses the Site Test Bus 5 to both control the operation of the DUT Tester and receive therefrom information about test outcomes. The DUT Tester 6 is capable of generating at high speed the various DUT memory cycles that are involved in the test regimen, and it decides if the results of a Read memory cycle are as expected. In essence, it responds to commands or operation codes ("named patterns") sent from the Test Site Controller by initiating corresponding useful sequences of Read and Write DUT memory cycles (i.e., it executes the corresponding patterns). Conceptually, the output of the DUT Tester 6 is stimulus information that is to be applied to the DUT, and it also accepts response information therefrom. This stimulus/response information 7a passes between the DUT Tester 6a and a Pin Electronics #1 assembly 9a. The Pin Electronics assembly 9a supports up to sixty-four probes that can be applied to the DUT 14.

The above-mentioned stimulus information is just a sequence of parallel bit patterns (i.e., a sequence of "transmit vectors" and expected "receive vectors") expressed according to the voltage levels of some family of logic devices used in the DUT Tester. There is a configurable mapping between bit positions within a stimulus/response and the probes going to the die, and this mapping is understood by the DUT Tester 6. The individual bits are correct as to their timing and edge placement, but in addition to the mapping they may also need voltage level shifting before they can be applied to the DUT. Likewise, a response that originates in the DUT subsequent to a stimulus may need buffering and (reverse) level shifting before it can be considered suitable for being fed back to the DUT Tester. These level shifting tasks are the province of the Pin Electronics 9a. The Pin Electronics configuration needed for testing a WHIZCO 0013 likely will not work for testing a part from the ACME Co., and perhaps not even with another WHIZ Co. part. So, it will be appreciated that the Pin Electronics assembly needs to be configurable also; such configurability is the function of the PE Config lines 8a.

The above concludes a brief architectural overview of how a single Test Site is structured for testing a DUT. We turn now to issues that arise when there are many Test Sites with which to operate. As a preliminary, we shall describe a preferred embodiment for constructing a Test System having multiple Test Sites. In many respects, some of the information we are about to describe are matters of choice based on market studies of customer preference and cost benefit analyses. Be that as it may, to build one of these things one has to make definite choices, and once that is done there are particular consequences that are visible throughout the entire system. It is felt that it is useful to describe, at least in a general way, the larger outlines of the hardware properties of the Test System. Even though some of these properties are contingent, a knowledge of them will nevertheless assist in an appreciation of various examples used to illustrate the invention.

To begin, then, consider four rather large card cages. Each card cage has, besides power supplies and water cooling (fans can be a source of contamination in a clean room environment, and chilled water is cheaper than air conditioning to remove the several tens of KW of dissipated heat for a fully loaded system), a mother board, a front plane and a back plane. Into each card cage can be placed up to nine assemblies. Each assembly includes a Test Site Controller, DUT Tester and Pin Electronics. We shall be describing the general outlines of how Test Site Controllers are bonded together, which will involve some busses used to create daisy chains.

A brief digression concerning the term "daisy chain" is perhaps in order. Consider system elements A, B, C and D. Suppose that they are to be daisy chained together in that order. We could say that there is an information or control path that leaves A and goes into B, that B can selectively pass on traffic that then leaves B and goes into C, and that C can selectively pass on traffic that then goes into D. These same kind of arrangements can exist for traffic in the other direction, too. Daisy chains are often used to create priority schemes; we shall use them to create master/slave relationships between various the Test Site Controllers. We shall denote these daisy chained style communication arrangements with the suffix noun "DSY", instead of "BUS". Thus, we might refer to a Command /Data DSY instead of a Command/Data Bus. Now, the notion that information "enters B and is selectively passed on" may suggest that traffic is replicated onto a separate set of conductors before being passed on. It could be that way, but for performance reasons it is more like a regular bus having addressable entities. By means of a programmable address mapping arrangement and the ability to put portions of downstream Test Site Controllers "to sleep," the single bus can be made to logically appear (i.e., to function) as a plurality of daisy chains. Finally, it will be appreciated that the daisy chains are high performance pathways for command and control information, and that if they were not, then we could not expect a master/slave combination (multi-site Test Station) to operate as fast as a single Test Site does. For the benefit of daisy chain performance, the various DSY do not leave their respective card cages. The effect of this decision is to place some limits on which Test Sites (and thus also how many) can be bonded together. In principle, there is no fundamental need for this limitation, nor is there a genuine lack of technical practicality involved (it could be done); it is simply felt that, since there are already nine Test Sites in a card cage, extending the DSY's adds significant cost for relatively little additional benefit.

To resume our discussion of FIG. 1, then, consider the various Test Site Controllers 4a–4z that can populate the four card cages, each with nine Test Site Controllers. Let's denote them as 4a–4f, 4g–4m, 4n–4t and 4u–4z. (Never minding, as explained earlier, that these are nominally only twenty-six subscripts—the reader is invited to imagine that there are another ten subscript symbols in there, someplace.) A CMD/DAT DSY 17a (Command & Data Daisy Chain) interconnects the Test Site Controller 4a–4f that are in one card cage, while a different CMD/DAT DSY 17b interconnects the Test Site Controllers 4g–4m in another card cage. The same arrangement exists for the remaining card cages, and Test Site Controllers 4n–4t and 4u–4z, respectively. We have earlier said that the DSY do not leave the card cages, in that the "tail end" of a bus that actually forms the DSY does not leave a card cage and become the head of the next segment in another card cage. Instead, the System Bus 3 from the Test System Controller 2 goes to all Test Site Controllers, and each is capable of becoming a Master at the head of a DSY segment that does not leave the card cage.

The CMD/DAT DSY 17a–d that we have been discussing exist between the various Test Site Controllers 4a–4z. There is a similar arrangement for the SYNC/ERR DSY 18*a*–18*d* and the DUT Testers 6*a*–6*z*. The synchronization and error information conveyed by the SYNC/ERR DSY 18 allows DUT Testers to function in unison. These two daisy chains (17 and 18) carry slightly different types of information, but each exists as part of the same general mechanism for bonding one or more Test Sites together into a Test Station.

We turn now to a discussion of FIG. 2, which is a simplified block diagram expansion of the DUT tester 6 of FIG. 1, of which there may be as many as thirty-six. It is sufficient at present to describe only one instance thereof. A glance at FIG. 2 will show that it is a fairly well populated with stuff; especially so for a "simplified" block diagram. Some of what is in the DUT Tester 6 and represented in the block diagram is functionally quite complicated, and is not available in "off the shelf" form. It is appropriate here to make two points. First, the primary purpose of including FIG. 2 is to describe the basic properties of an important operational environment within the overall Non-Volatile Memory Test System 1. The invention(s) that are fully described in connection with FIG. 3 and subsequent figures will either be expansions of mechanisms set out in the following description of FIG. 2, or they will be new mechanisms whose motivational premise is found in FIG. 2. Either way, as this is written it is not known exactly which of these is before the reader. The goal at present is to provide a simplified yet informative starting point for numerous different Detailed Descriptions of various Preferred Embodiments, so that each of those can be as concise as is appropriate (as opposed to one "jumbo" Specification that discloses everything about each different invention). The second point is that the expanded or extended material, while in general overall agreement with FIG. 2, may contain information that does not "match-up" exactly with the simplified version. This does not mean there has been an error, or that things are fatally inconsistent; it arises because it is sometimes difficult or impossible to simplify something such that it is the exact image in miniature. The situation is rather like maps. A standard size road map of Colorado will show that when going east on I-70 you can go north on I-25 at Denver. It looks like a left turn. And while it did used to be an actual left turn, it isn't one now, and a detailed map of that intersection will show a sequence of component turns and intervening road sections. But no one would say that the standard size road map is wrong; it is correct for its level of abstraction. Similarly, and despite its fairly busy appearance, FIG. 2 is indeed a simplification operating at a medium level of abstraction, but some seeming left turns are not simple left turns at all.

As is shown in FIG. 1, the major input to the DUT Tester 6 is an instance of the Test Site Bus 5, which originates from a Test Site Controller 4 that is associated with the instance of the DUT Tester 6 that is of interest. The Test Site Bus 5 is coupled to a Multi-Bus Controller 88 that converts traffic on the Test Site Bus to traffic on a Ring Bus 85 or a VT Bus 89. Ring Bus traffic can also converted to VT Bus traffic, and vice versa. Almost everything in FIG. 2 is part of some large scale integrated circuit; the Timing/Formatting & Comparison circuit 52 (described below) is actually eight such IC's, although we show it as one entity for the sake of brevity. Save for the various Ext. DRAM's (some of which are also part of the Interior Test Memory 87—see FIG. 3), most of the rest of the stuff in FIG. 2 is part of another large IC called the APG (Automatic Pattern Generator). The Ring Bus 85 is a general purpose inter-mechanism communication path for configuring the major elements within the APG portion of the DUT Tester 6, and for setting modes of operation, etc. There also various dedicated very wide and high speed paths between various elements of the APG. The VT Bus 89 is an IC to IC bus for use within the DUT Tester itself.

The Ring Bus 85 is the mechanism by which the Test Site Controller communicates with the APG portion of the DUT tester 6. The Ring Bus 85 is coupled to a Micro-Controller Sequencer 19, which may be likened to a special purpose microprocessor. Using an address created by a Next Address Calculator 102, it fetches instructions from a program stored in a program memory, which may be either internal to the Micro-Controller Sequencer 19 (PGM SRAM 20) or external thereto (EXT. DRAM 21). Although these two memories appear to be addressed by what is essentially a logically common address 63 that serves as a program counter (or, instruction fetch address), and either can be a source of programming to be executed, note that: (1) Only one of the memories performs instruction fetch memory cycles during any period of time; and (2) In fact they are addressed by electrically different signals. The SRAM is fast and allows genuine random access, but consumes valuable space within the Micro-Sequence Controller 19 (which is part of the large APG IC), so its size is limited. The external DRAM can be provided in adjustable amounts of considerable quantity, but is fast only when accessed in sequential chunks involving linear execution and no branching. Programming in the SRAM 20 is most often that which is intensely algorithmic, while the EXT. DRAM 21 is best suited for material not readily generated by algorithmic processes, such as initialization routines and random or irregular data.

The Next Address Calculator 102 can implement branching in the test program being executed, in response to unconditional jump instructions or to conditional jump or conditional subroutine instructions conditioned on various PROGRAM CONTROL FLAGS (25), OTHER FLAGS (55), and certain other signals that, for clarity are shown separately (DFE 0:3 103 and DPE 0:3 104) and which are provided for multi-DUT operation.

The instruction word fetched and executed by the Micro-Controller Sequencer 19 is fairly wide: two hundred and eight bits. It consists of thirteen sixteen-bit fields. These fields often represent fetched instruction information for mechanisms that are outside the Micro-Controller Sequencer proper. Such fields are dedicated to their associated mechanisms. One set of ALU INSTRUCTIONS 22 areis applied to a collection of eight sixteen-bit ALU's 24, while others are disbursed to various other mechanisms distributed throughout the DUT Tester. This latter situation is represented by the lines and legend "VARIOUS CONTROL VALUES & INSTRUCTIONS" 42.

The eight sixteen-bit ALU's (24) each have a conventional repertoire of arithmetic instructions built around associated sixteen-bit result registers (each ALU has several other registers, too). Three of these result registers and their associated ALU's are for generating X, Y and Z address components 27 that are variously combined into a complete address to be supplied to the DUT. Two more of the eight ALU/registers (DH & DL) are provided to assist in the algorithmic creation of thirty-two bit data patterns 28 that are divided between a most significant portion (DH) and a least significant portion (DL). A final three ALU/registers (A, B, C) are used as counters and contribute to the production of various PROGRAM CONTROL FLAGS 25 that assist with program control and branching on completion of some programmatically specified number of iterations or other numerical condition. These PROGRAM CONTROL FLAGS 25 are sent back to the Micro-Controller Sequencer 19, where they affect the value of the instruction fetch address (created by Next Address Calculator 102) in ways familiar to those who understand about micro-programmed execution mechanisms. There are also various OTHER FLAGS 55 that also can be used to effect program branching. These originate with various ones of the other mechanisms within the DUT Tester 6 that are controlled by the different fields of the fetched instruction word. One specific additional flag is expressly shown as a separate item: VEC_FIFO_FULL 26. In another drawing having somewhat less detail it might be lumped in along with the OTHER FLAGS 55. We have separated it out to assist in explaining one aspect of the operation of the Micro-Controller Sequencer 19.

What VEC_FIFO_FULL does is to (temporarily) halt further program execution by the Micro-Controller Sequencer 19. There are many stages of pipeline between the instructions fetched by the Micro-Controller Sequencer 19 and the mechanism that finally hands test vectors off to be applied to the DUT. In addition, part of the baggage that accompanies a vector as it moves toward being applied to the DUT is information concerning the rate of eventual vector application, or, each vector's duration. Thus, the rate of vector application to the DUT need not be constant, and in particular, a Group of vectors may take longer to apply than they did to generate. The Micro-Controller Sequencer simply executes programming at its maximum rate. But clearly, on average, the rate of "vector consumption," as it were, must equal the rate of "vector production," lest the pipeline need to be elastic nearly without limit. There is a Vector FIFO 45 at the output of the Address Mapper 29 discussed below, and it serves as an elastic capacity in the pipeline. The signal VEC_FIFO_FULL is used to prevent overrunning the limited number of stages in the pipeline, by causing a temporary cessation in the production of new vectors at the head end of the pipe.

To continue, the (three times sixteen equals forty-eight bits of) X, Y and Z address components 27 are applied to an Address Mapper 29, whose output is a selected-in-advance nearly arbitrary rearrangement of the address values in the ordered forty-eight bit address space. As a point of departure for appreciating this, suppose for a moment that the Address Mapper 29 were a memory that fully populated a forty-eight bit address space, and that it held a forty-eight bit value at each address. (Temporarily never mind that such a memory would—today anyway—be size of a large refrigerator.) Given such a memory, a look-up table could be implemented that could map any applied address into another, arbitrarily selected, forty-eight bit value which could then be used as a replacement address. The reason that such address mapping is desirable is that the X, Y and Z address components generally have useful meaning in the context of a particular DUT's internal architecture, which is most likely not implemented with one big linear decoder. The notions of rows, columns and layers, block or pages may be very useful to the Test Engineer, and failures that occur in locations that are physically close together may involve corresponding closeness in their X, Y and Z addresses. Such patterns in the test results can be valuable in appreciating what is wrong and in trying to fix it, whether at a design level or at a production level of reprogramming a part to shunt a defective section's operation with that of a spare section. Two issues arise from such thinking. The first is paring the forty-eight bits down to the actual number of bits (say, thirty-two, or perhaps sixteen) to be applied to the DUT. We shall shortly briefly mention how the paring down is done, and it is largely a matter of taking this many bits from X, that many from Y and the rest from Z. But not entirely, and this is the second issue, because certain addresses might lie within circuitry that is a left-for-right (or left-for-right and top-for-bottom) mirror image of another section of circuitry. This has the effect of rearranging what the bits mean, as far as what sequential address values are in physical order within that circuitry. This chip layout property may occur many times, and it may well be the case that how one Group of bits for, say, Y, are interpreted, may depend upon the accompanying value of some other, say, Z bits. The address mapper 29 is provided to allow the raw X, Y and Z addresses to be "repackaged," as it were, to reflect this sort of thing for the benefit of those who would test memories having such internal architectural arrangements. As to how its actually done, the Address Mapper 29 is constructed of a fairly large number of interconnected multiplexers. It cannot implement the completely arbitrary look-up table behavior of a fully populated memory decode scheme as was temporarily assumed above for purposes of explanation. It can however, rearrange sub-fields of the X, Y and Z address components as needed, particularly since there is yet another mechanism that will do the paring down from forty-eight bits to the actual number needed. The Address Mapper 29 also contains three sixteen bit (address) look-up tables that allow it to perform limited arbitrary mapping within local ranges.

The mapped address output 30 of the Address Mapper 29 is applied as an address to various Buffer Memories and Tag RAM's 31A–C and to an Error Catch RAM 32, which, while having separate functions, may nevertheless be implemented as selectable partitions in the four Memory Sets that are collectively the Interior Test Memory 87. The mapped address output 30 is also applied as one input to an Addr. Bit Select circuit 37, whose multiplexing function is described in due course. The Interior Test Memory can be configured to contain many instances of various RAM-based memory structures used for different functions. This is accomplished by declaring that certain portions of the different Memory Sets are to be used for the associated purposes. What is shown in FIG. 2 is one such arrangement; arrangements can be changed as testing proceeds, and this whole business of Memory Set usage should be considered to be very dynamic. None of the inhabitants of the Interior Test Memory (e.g., the error Catch RAM 32) are permanent hardware fixtures. What is permanent are the four Memory Sets. But which part of which Memory Set is an Error Catch RAM at any given time (if indeed there is even one defined) is dependent on whatever configuration has been established.

Consider the Buffer Memories 31A and 31C. Their functions are to retain data patterns 33 and addresses 34 that can be applied to the DUT. These are actual separate outputs from their associated Buffer Memories, although these Buffer Memories are not a dual "port memories," but are preferably composed of portions of two different Memory Sets. In keeping with this, it is preferred that Stored Data 33 is kept in one Memory Set, while Stored Addresses 34 are kept in another. Also, we have not shown an explicit mechanism for writing to a Buffer Memory. One way that may be accomplished is by an addressed bus operation initiated by a Test Site Controller 4 at the behest of the program it is executing. There is an "under the floorboards," as it were, "utility services" bus called the Ring Bus 85 that goes to just about everything in FIG. 2 (most of the visitations of which are not shown—as that would clutter the drawing immensely). Another and faster way of writing information to the Memory Sets is described in connection with FIG. 3.

The Error Catch RAM 32 is addressed by the same address that is applied to the Buffer Memories, and it either stores or retrieves information about errors, which operations are performed in conjunction with a Post Decode Circuit, to be discussed later. As with the paths 33 and 34 from the Buffer Memories 31 A and 31 C, paths 62A–D from the Error Catch RAM are preferably MUX'ed outputs from a portion of a Memory Set (declared to be the current Error Catch RAM 32), in accordance with configuration information distributed by the Ring Bus (not shown).

Note that the Data MUX 35 has as inputs the STORED DATA output 33 from the Buffer Memory 31 A as well as data 28 from the registers DH and DL in the collection 24 of ALU's. The Data MUX 35 performs an initial selection, in accordance with values 36 stored in PGM SRAM 20, of which of these inputs (28,32) to present as its output 38, which, unless modified as described next, is then applied as one of two vector components to a Transmit Vector Mapper/Serializer/Receive Vector Compare Data Circuit 40 (the other component is the output 39 of the Addr. Bit Select circuit 37). Data MUX 35 also performs a substitution of the initial selection by a replacement value used for "column jamming" described later according to a Column Jamming Mode signal (not yet shown) and values obtained from a Tag RAM operated as a Bad Column Table 31B. This entire mechanism will be fully described in due course.

Circuit 40 can perform three vector related functions: assemble vector components (38, 39) into an ordered logical representation of an entire vector that is to be applied (transmitted) to the DUT; apply an arbitrary dynamic correspondence (mapping) between the ordered bits of the logical representation of the transmit vector and the actual physical channel number of the Pin Electronics (i.e., which probe tip) will contact the DUT on behalf of that signal (i.e., that bit in the vector); and, cooperate with the compiler in the division of an entire logical vector into pieces to be applied separately and in order (serialization) for DUT's that admit of such a thing. Which of these functions is performed is determined by control signals from an SRAM 41, which is also addressed in accordance with a field in the two hundred and eight bit instruction fetched by the Micro-Controller Sequencer 19.

Also contained within circuit 40 is a section of DUT Disable Logic 90. Its purpose is to respond to various conditions, some static, some contingent on test outcomes, but all defined programmatically, that indicate which one or more DUT's, among as many as four thereof, are to be disabled. These indications are carried by four signals DD 0:3 44b (DUT Disable for DUT Zero, for DUT One, etc.) This is in support of multi-DUT testing on a Test Site, and is further explained in the associated incorporated Application. The output of Circuit 40 is an up to sixty-four bit vector 44a that, along with the DUT Disable signals 44b, is applied to a Vector FIFO 45, which when full generates the signal VEC_FIFO_FULL 26, whose meaning and use was discussed above. The vector at the top of the Vector FIFO 45 is removed therefrom upon receipt of a signal VEC_FIFO_UNLOAD 47 that originates at a Period Generator 49 (to be discussed shortly). Such removed vectors (46) are applied to a Timing/Formatting & Comparison circuit 52 that is connected to the DUT via the associated instance of Pin Electronics 9. That is, each instance (among the various Test Sites) of Pin Electronics 9 receives Transmitted & Received Vectors 7 and Pin Electronics configuration information 8 from its associated Timing/Formatting & Comparison circuit 52.

The Timing/Formatting & Comparison circuit 52 is coupled to the VT Bus 89 to receive configuration and control information. It will be recalled that the Timing/Formatting & Comparison circuit 52 is actually eight IC's, which for our purposes we are treating as a single entity.

The Timing/Formatting & Comparison circuit 52 has an Internal SRAM 54 addressed by the same Instruction Address ("A" in the small circle) as is the Program SRAM 20 of the Micro-Controller Sequencer 19. (An External DRAM 53 may be used in place of the Internal SRAM 54, but is locally addressed by an incremented counter that is not shown.) The Internal SRAM 54 (or external DRAM 53) assists in the production of Drive and Comparison cycles, which have associated formats. Drive cycles apply a transmit vector to the DUT using a pre-selected format supplied by one of RAM's 54 or 53. Comparison cycles receive a vector presented by the DUT and examine it, also according to a pre-selected RAM-supplied format, to determine if it matches previously supplied comparison data. Both Drive and Comparison cycles are adjustable as to their duration, and appropriately adjustable as to whether and when a load is applied, when data is latched or strobed, if a signal is Return-To-Zero or not, whether to surround a driven signal with its complement, etc. (These options are the various formats mentioned above.)

The comparison produced by the Timing/Formatting & Comparison circuit 52 includes information, on a per channel basis, about whether a channel failed because a logical value was wrong (a functional error) and/or because its electrical properties are outside acceptable limits (a parametric error). Furthermore, and as is explained in an incorporated Application, when multiple DUT testing is performed it is known which channels are associated with which DUT's. This allows the production of the four signals DFE 0:3 (DUT # Functional Error) 103 and the four signals DPE 0:3 (DUT # Parametric Error) 104.

The comparison performed by the Timing/Formatting & Comparison circuit 52 also produces a sixty-four bit value 56 that is applied to a Receive Vector Reverse Mapper/Deserializer 57, whose function may be considered to be the logical inverse of circuit 40. (The operation of circuit 57 is controlled by an SRAM 58 that corresponds to the control of circuit 40 by SRAM 41.) In turn, the output 59 of circuit 57 is applied to the Post Decode circuit 60. At present, it is sufficient to say that the Post Decode circuit 60 can inspect via programmatic criteria both incoming error information 59 and error information previously stored in the Error Catch RAM to produce condensed and more readily interpretable error information which may then by stored back into (a different part of) the Error Catch RAM 32 via path 61. An example would be to create a count of how many times there was an error within a particular range of addresses, which information may be useful in deciding when to attempt to engage in on-chip repair by enabling substitute circuits.

We turn now to the Period Generator 49 and its associated Timing SRAM 51. These respond to an eight bit signal T_SEL 43 that, for each two hundred and eight bit instruction fetched by the Micro-Controller Sequencer 19, determines a duration for the associated operation of the Timing/Formatting & Comparison circuit 52. T_SEL 43 is member of the Various Control Values & Instructions 42 that are represented by the different fields within the fetched instruction. As an eight bit value it can represent or encode two hundred and fifty-six different things. In this case those "things" are twenty-eight bit values stored in the Timing SRAM 51 and that are addressed by T_SEL. Each addressed twenty-eight bit value (23) specifies a desired duration with a 19.5 picosecond resolution. The sequence of accessed twenty-eight bit duration values (23) is stored in a Period FIFO 50 so that the individual members of that sequence will be retrieved and applied in synchronism with the retrieval of their intended corresponding vector, which is stored in the Vector FIFO 45.

A coarse timing value field in the oldest entry in the FIFO 50 conveys duration information with a resolution of 5 nsec, and produces therefrom a signal VEC_FIFO_UNLOAD 47 that transfers the next transmit vector from the Vector FIFO 45 to the Timing/Formatting & Comparison circuit 52. A companion signal TIMING REMAINDER 48 is also applied to circuit 52. It is there that the ultimate resolution to 19.5 picoseconds is accomplished.

Figure 3:
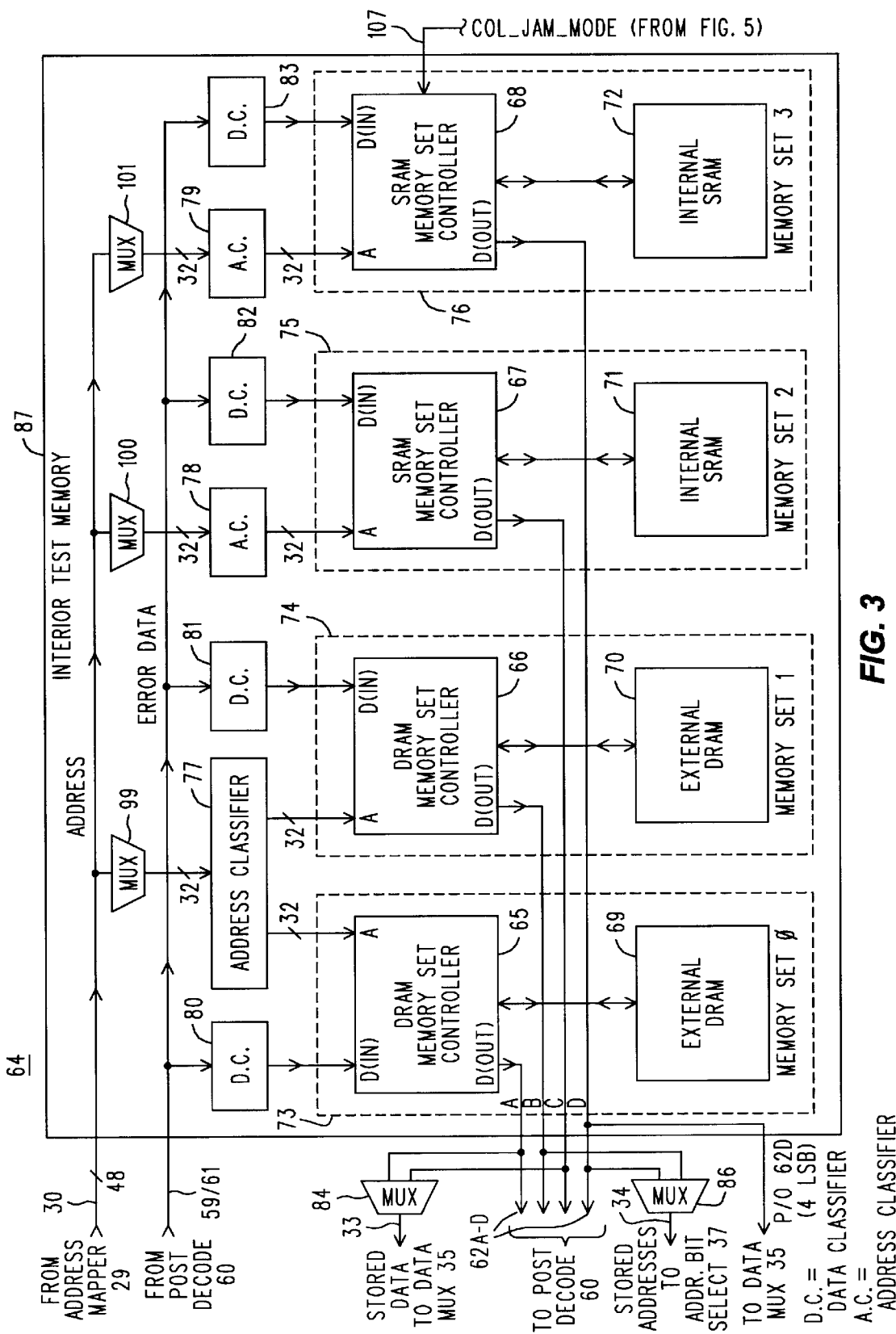
FIG. 3 is a simplified functional block diagram of the interior test memory mechanism that appears in the block diagram of FIG. 2.

Refer now to FIG. 3, which is a simplified block diagram 64 of the Interior Test Memory 87 in the block diagram of FIG. 2. It receives a forty-eight bit mapped address 30 from the Address Mapper 29, which is applied to various Address Classifiers 77, 78 and 79. The Address Classifiers are associated with Memory Sets 73–76, which are each complete memory mechanisms that can individually perform various functions, such as being an ECR 32. Two of these Memory Sets (73,74) are of external DRAM, while two are of internal SRAM. The two external DRAM Memory Sets will always have the same Address Classifier function in effect, and thus share one common Address Classifier 77. The internal SRAM Memory Sets 75 and 76 each have their own associated Address Classifiers, 78 and 79, respectively. These Address Classifiers can either pass an address through unchanged, or modify it in ways to be described in some detail in one of the incorporated Applications.

Each Memory Set includes a Memory Set Controller; the external DRAM Memory Sets 73 and 74 have DRAM Memory Set Controllers 65 and 66, respectively, while the internal SRAM Memory Sets 75 and 76 have respective SRAM Memory Set Controllers 67 and 68. During the testing of a DUT the address for memory transactions directed to any of these Memory Sets arrives at the associated Memory Set Controller from the respectively associated Address Classifier. During the testing of a DUT Error Data 61 arriving from the Post Decode circuit 60 and that is to be written into an ECR is first applied to Data Classifiers 80–83, one of which is associated with each Memory Set. The Data Classifiers may or may not change the data applied to them, depending upon how they are configured and the function they are to perform. The Address and Data Classifiers represent high speed paths for addresses and data, respectively, which are intended to operate at the highest speeds Necessary. We shall shortly see that the Ring Bus (not yet shown) provides another way to convey .addresses and data to the Memory Sets.

At this point we have four Memory Set Controllers (65–68) that each have incoming (classified) addresses and (classified) data. Each of these Memory Set Controllers is coupled to an associated memory: DRAM Memory Set Controllers 73 and 74 are respectively coupled to external DRAM's 69 and 70, while SRAM Memory Set Controllers 75 and 76 are respectively coupled to internal SRAM's 71 and 72. These arrangements constitute the four Memory Sets 73–76, two of which (75, 76) have modest amounts of high speed SRAM, and two of which (73, 74) have large amounts of slower DRAM. What is of interest to us at present is how the DRAM Memory Sets can be made as fast as the SRAM Memory Sets, as well as how to incorporate certain alternatives concerning configuration of the DRAM, depending upon user preference and test program strategy. Thus, it is going to turn out that the DRAM Memory Set Controllers 65 and 66 are configurable, perform different types of memory transactions, and are not altogether the same as the simpler SRAM Memory Set Controllers 67 and 68. For the sake of brevity, FIG. 3 does not show the structure that provides this flexibility; for now let's just say that each Memory Set Controller is connected to the Ring Bus (not yet shown), from which it is instructed in the particular mode of operation and configuration that are desired. Some of these modes involve how data is stored, and some have to do with getting it back out again. To conclude, then, note that each Memory Set does have an associated Data Out (62A–D) which is sent to the Post Decode Mechanism 60 for further processing.

Note also that the data outputs from Memory Sets zero and two are applied to a MUX 84 whose output becomes STORED DATA 33 that is sent to Data MUX 35. Similarly, the data outputs from Memory Sets one and three are applied to a MUX 127 whose output becomes STORED ADDRESSES that are sent to the Addr. Bit Select MUX 37. The reason for having MUX's 84 and 86, and the details of how they are controlled, are not of particular interest in the present disclosure;

they are discussed in the incorporated Applications.

Memory Set Three 76 receives a Bad Column Mode signal (COL_JAM_MODE 107) that is not received by any other Memory Set. The Controller 68 for Memory Set Three uses this signal to support a special mode of operation to be described in due course. What should be understood at this point is that when COL_JAM_MODE 107 is TRUE, and it is not the case that a write memory cycle is being initiated, then the presentation of a new address will cause an automatic read cycle to occur at that address. The four least significant bits of the resulting read data is sent to the lower portion of DATA MUX 35. (A special Bad Column table is being read, and how the data is snagged and put to use is a subject for later discussion.)

Figure 4:
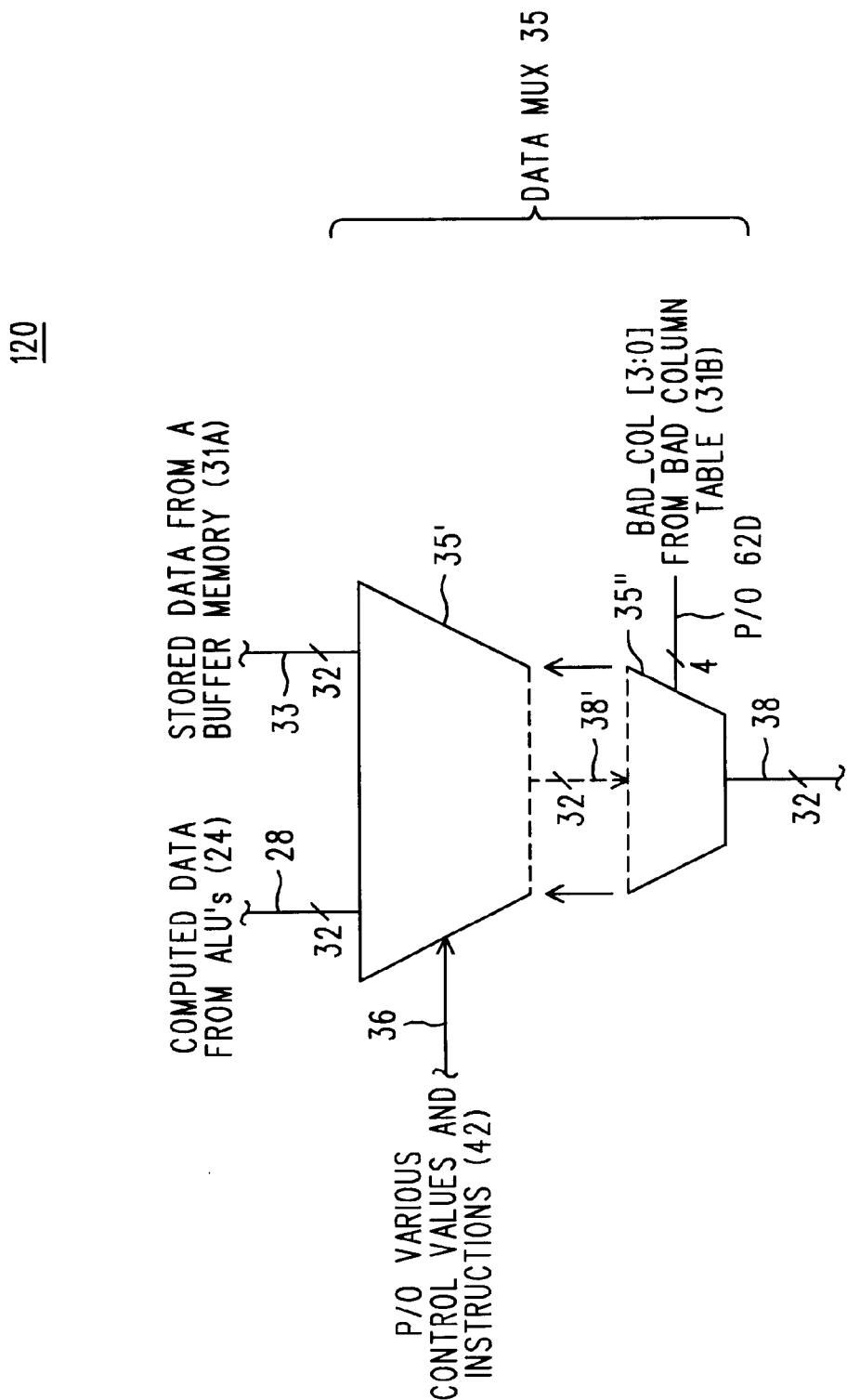
FIG. 4 is an expanded simplified block diagram of the Data MUX 35 of FIG. 2.

Now consider FIG. 4, which is an expanded block diagram 120 of the DATA MUX 35 of FIG. 2. The primary purpose of the figure is to allow the separation MUX 35 into two parts, 35' and 35", coupled by data path 38'. Portion 35' operates as a conventional MUX, in that it performs a (preliminary, or initial) selection from among inputs 28 and 33 to be the output 38', according to input control signal 36. Our real interest at present is with portion 35", which receives 38' as a data input and BAD_COL [3:0] as control inputs (they are the four least significant bits of 62D from Memory Set Three 76).

Figure 5:
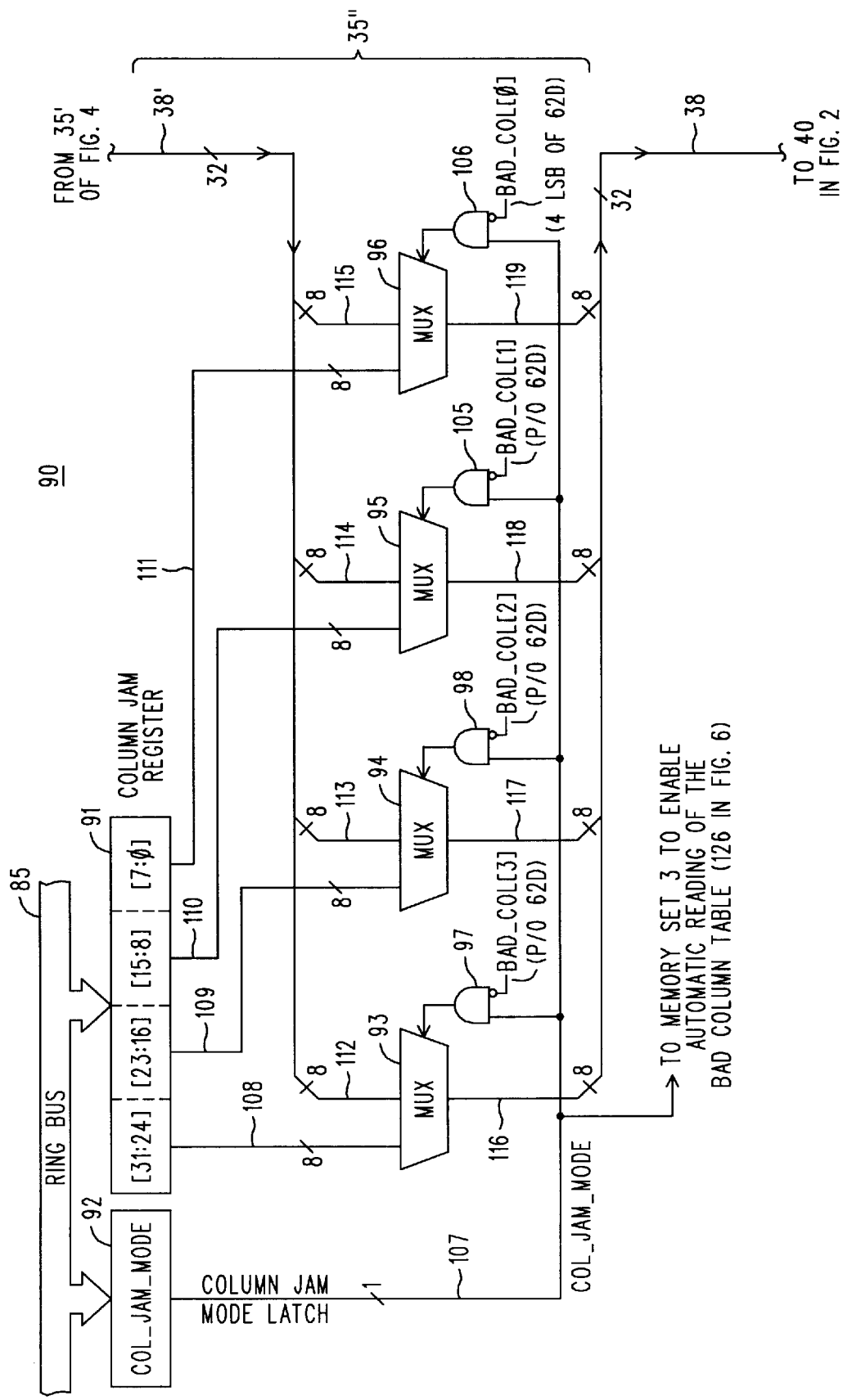
FIG. 5 is the actual block diagram of the expansion shown in FIG. 4.

Accordingly, refer now to FIG. 5, which is a block diagram 90 of the portion 35" depicted in FIG. 4. It has as a data input the thirty-two bit data 38', which is partitioned into four eight-bit groups 112–115 of related (adjacent) significance. This division into four eight-bit units cooperates well with the multi-DUT mode of operation, should it also be in effect. To continue, each of these groups of eight bits (112–115) is respectively applied as one input to an associated eight-pole two-throw MUX 93–96. The other inputs to these MUX's are the eight-bit groups 108–11, respectively, which originate from a thirty-two-bit Column Jam Register 91 that can be set over the Ring Bus 85.

The idea is that, under the right circumstances, all or a portion of the data 38' on its way to circuit 40, can be replaced by data that has been placed ahead of time in the Column Jam Register 91. The plan is to use a value that, when used as a programming value for a FLASH DUT that DUT will respond immediately as if the requested value were successfully programmed, even if in reality it has not been. Recall that the urge here is to avoid spending time programming a column that is known or suspected of being defective. (Instructing a modern FLASH part to program a 1 is such a value.)

This replacement can, in the present embodiment, be performed with eight-bit resolution, so as to match the more common multi-DUT scenarios. The fit is a good one for eight, sixteen, twenty-four and thirty-two bit parts. For four-bit parts, twelve-bit parts, etc, there are some wasted bits. This can be avoided by decreasing the granularity below eight bits, perhaps all the way down to two bits, or even one bit. In the two bit case the four MUX's 93–96 would be replaced by sixteen two-pole two-throw MUX's, and in the one bit case by thirty-two single throw double pole MUX's.

So, for example, if there were two sixteen-bit parts under test, one using bits [31:16] of 38'/38, and the other using bits [15:0], then if the part on bits [15:0] had a bad column at some applied address, the desire is to detect that the address is being applied, that the Column Jamming Mode is in effect (the name we give to outfoxing the Test Program/DUT to avoid the time wasted trying to program a known bad column) and then replace bits [15:0] of data 38' with, say, all 1's, from the least significant bits of Column Jam Register 91.

Now, if one knew that bit 3 were the culprit, then it would be possible to only jam that bit and let the others be normal. This could be done either by having one-bit resolution, or by having the actual real data (as would ordinarily be on 38') in bits [15:4] and [2:0] of the Column Jam Register, with bit 3 being a residual jammed 1. Getting that arranged over the Ring Bus might be slow, but is still a possibility. The savings would be the difference between what it takes to program the good fifteen bits and the time-out associated with programming the bad bit 3.

Several paragraphs up we talked about doing all this "under the right circumstances." The "right circumstances" are that the Column Jamming Mode has been selected by setting the Column Jam Mode Latch 92 with a suitable operation over the Ring Bus 85. Setting that latch 92 sets one input to a collection of AND gates 97, 98, 105 and 106. The other inputs to these gates are indicators obtained from a Bad Column Table (126 in FIG. 6), that are the four least significant bits of 62D (the data from Memory Set Three 76). This data is obtained from an automatic read at the applied address whenever the signal COL_JAM_MODE 107 is true. To this end, that signal (107) is also supplied to the Memory Set Controller 68 of Memory Set Three, as described earlier in connection with FIG. 3. The resulting indicator signals (four LSB of 62D) are named BAD_COL [3:0].

The usual case in the Memory Tester is that device failures are represented by zeros, so the signals BAD_COL [3:0] are each inverted as they are applied to their respectively associated AND gates. The result is that the MUX's 93–96 are controlled to select as their outputs the bits from the Column Jam Register whenever COL_JAM_MODE is TRUE and an associated one of the BAD_COL bits is zero (meaning the associated column for one of those MUX's is bad). Increases in replacement resolution also require a corresponding increase in the number of bits in BAD_COL and width in the table 126 from which it is read.

In any event, the outputs 116–119 of the MUX's 93–96 are collected back into one thirty-two bit stream as data 38 and sent to circuit 40, as previously described in connection with FIG. 2.

Figure 6:
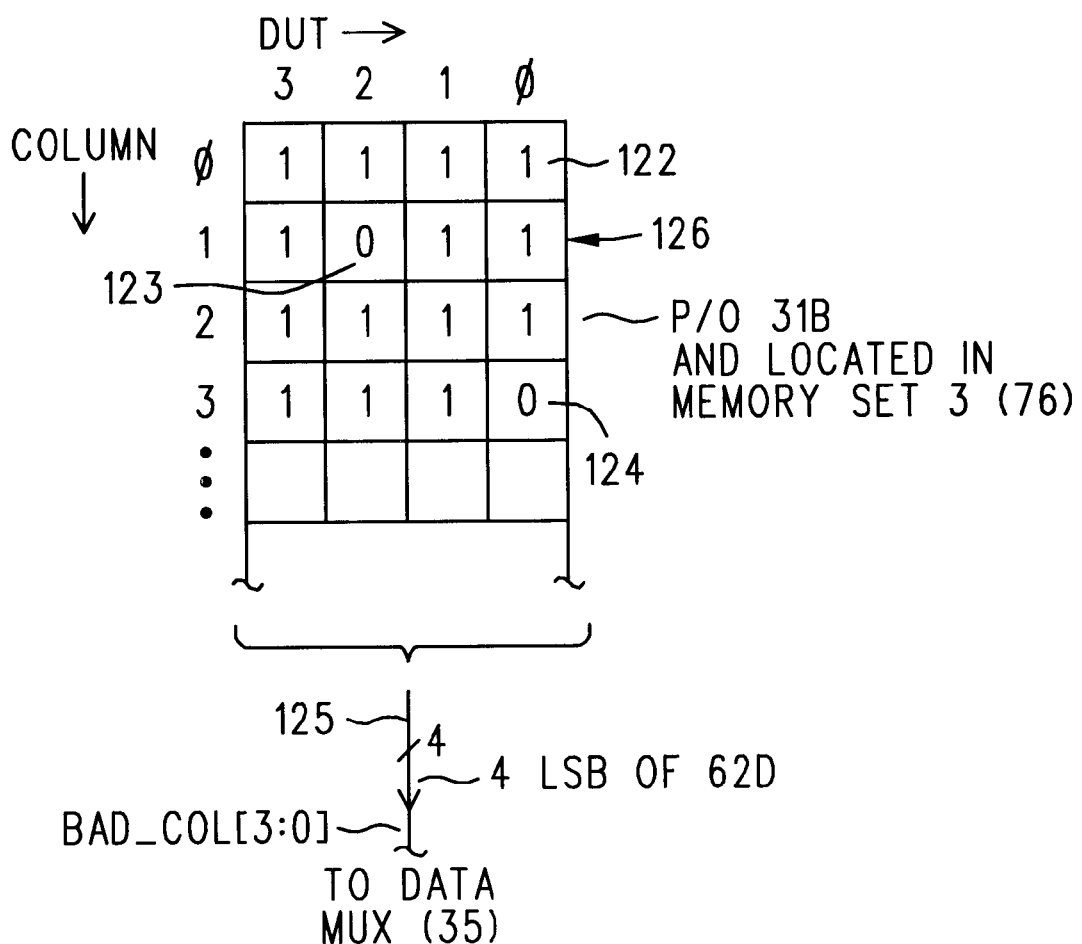
FIG. 6 is a functional diagram of a bad column table maintained in a Memory Set located within the Interior Test Memory of FIG. 2.

Refer now to FIG. 6, which is a depiction of the Bad Column Table 126 that may be maintained in Memory Set Three by the test program. Memory Set Three is necessary in the present embodiment, since multi-DUT operation uses a similar automatic read-the-table mechanism in Memory Set Two for multi-DUT operation, and the remaining Memory Sets are not available for this class of service. This limitation is contingent on perceived economic trade-offs, and could, from a technical viewpoint, be removed.

To continue then, the Test Program writes an entry of zero into a cell of table 126 when it has determined that a column is bad, either during a programming phase or later, during an exercise phase. Each row of the table 126 has four cells, each of which represents the four groups of eight bits that are the resolution of the current mechanism. Whether a group of eight bits represents a DUT in a multi-DUT test or a segment of a single DUT is a matter of choice for the Test Engineer. A single thirty-two bit DUT would, with whole word width resolution, set or clear all four bits in a row of table 126 in unison. In the same way, register 91 of FIG. 5 would be a unified collection of all 1's. If the replacement resolution were a single bit, then a row in table 126 would be thirty-two bits across to produce BAD_COL[31:0]. (There would then also be thirty-two MUX's and thirty-two. AND gates in FIG. 5, etc.)

If one were to refer to the incorporated Application pertaining to multi-DUT operation he would discover that there is a Bad Block (DUT) Table that is similar to the Bad Column table 126 described above. In the bad DUT case the Bad Block Table is kept in old and new versions to allow graceful incremental additions to the table. That could also be done here, but given that the majority of the bad column information is likely to be discovered and stored during a column to column visitation during a preliminary programming phase, it is felt that there is little or nothing to be gained by such a duplication of tables here.

Figure 7:
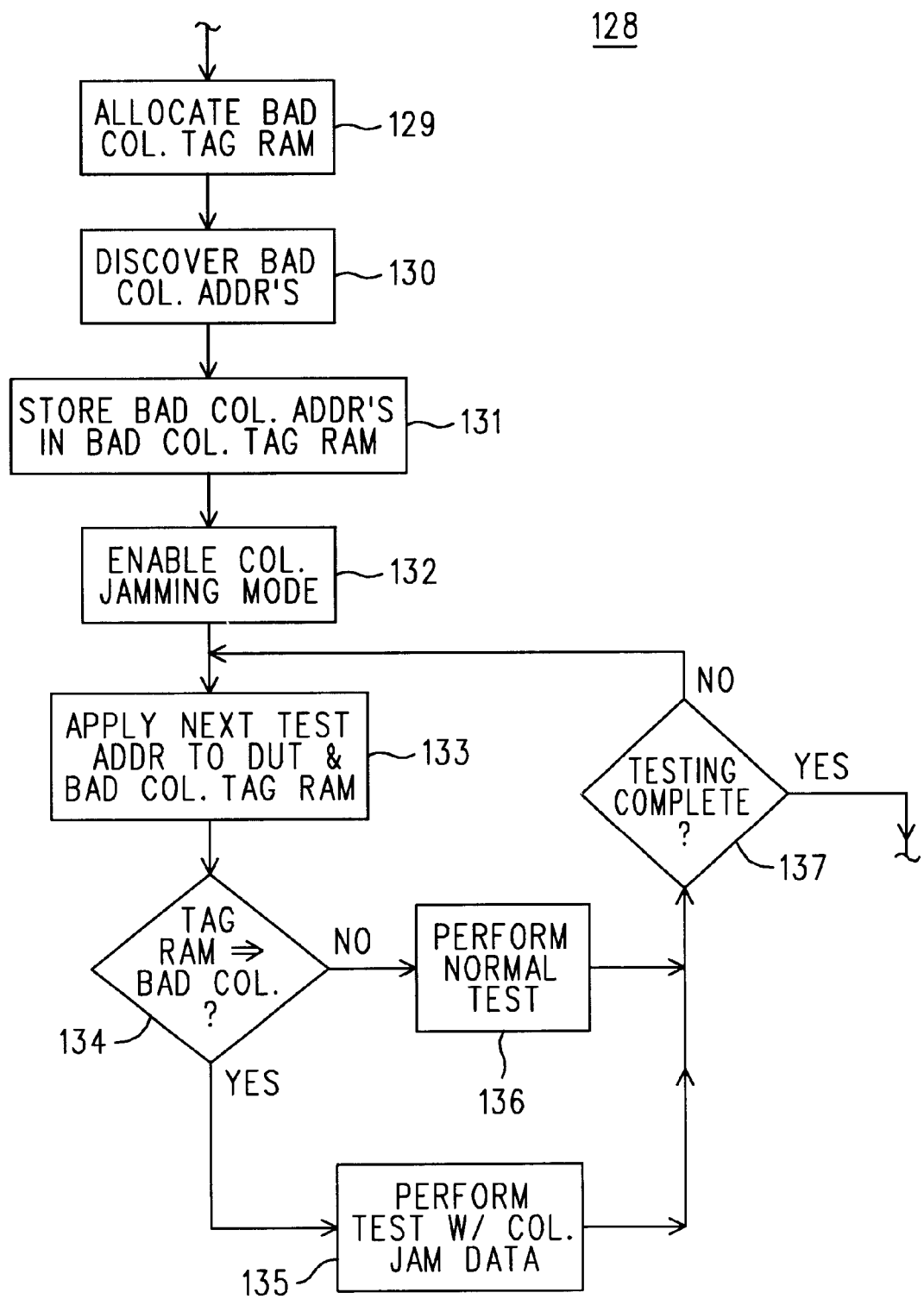
FIG. 7 is a flow chart describing a method of omitting the programming of addresses in columns that have been detected as being defective.

In the present example, cell 122 (and most of the others) contain a "1" to indicate that there is no failure. On the other hand, cells 123 and 124 contain 0's to indicate that column 1 in DUT 2 is bad, as is column 3 in DUT 0; and In summary then, and with reference now to FIG. 7, it will now be appreciated that the flow chart 128 therein is a restatement of the column jamming operations just described. In particular, at step 129 a bad column tag RAM (Bad Column Table 126 of Memory Set Three) is allocated for such use. Steps 130 and 131 represent any initial testing done to discover bad column addresses, which if found, are stored in the bad column tag RAM. This activity would be an initial programming phase of the test program, as previously mentioned in the Summary Of The Invention. Such preliminary discovery may or may not be performed, however, depending upon the wishes of the test designer. In any event, the column jamming mode is then enabled by step 132.

At step 133 the test program enters a loop that performs the main portion of the test program. The important thing here (as far as the present topic is concerned) is that the test address is applied both to the DUT and to the bad column tag RAM (Bad Column Table 126 of Memory Set Three). If the bad column tag RAM indicates the column is good, then the test 134 directs test program flow by allowing the performance of a normal test operation at step 136 (no column jamming). If, on the other hand, step 134 indicates that the column is bad, then step 135 is performed in place of step 134. It will be appreciated that if the test fails, then that fact is noted as part of step 136 and that column is added to the bad column tag RAM. This is operation on the "as discovered" basis previously mentioned in the Summary Of The Invention, and also in connection with FIG. 6. The effect of this is to avoid programming a defective address by allowing the column jamming mode to indicate automatic and immediate success and advance the test program to its next step. Step 137 returns to step 133 if there is a remaining portion of the test program to perform, otherwise an exit is performed to whatever system activity is next.

We claim:

1. A method of avoiding spending time to program bad columns in a FLASH memory under test on a memory tester, the method comprising the steps of:

(a) establishing a TAG RAM addressed by the same address applied to the memory under test;

(b) determining that an applied address is associated with a bad column;

(c) storing in the TAG RAM at the applied address an indication that the column is bad;

(d) subsequent to steps (a) through (c), enabling an automatic data substitution mechanism during a subsequent phase of testing the memory under test, and thereafter:

(e1) applying a test address to the TAG RAM while attempting to program the memory under test at that test address; and (e2) if the TAG RAM contains an indication that the test address is associated with a bad column, then by automatic action of the memory tester replacing the data value to be programmed with one that will cause the memory under test to report immediate success.

2. A method as in claim 1 wherein the replacement data value to be programmed in step (e2) is all ones.

* * * * *